US006608792B2

(12) United States Patent  
Pitts

(10) Patent No.: US 6,608,792 B2
(45) Date of Patent: Aug. 19, 2003

(54) METHOD AND APPARATUS FOR STORING DATA IN AN INTEGRATED CIRCUIT

(75) Inventor: Robert L. Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/777,180

(22) Filed: Feb. 5, 2001

(65) Prior Publication Data
US 2002/0145931 A1 Oct. 10, 2002

Related U.S. Application Data
(60) Provisional application No. 60/247,544, filed on Nov. 9, 2000.

(51) Int. Cl.[7] .................................................. G11C 7/00
(52) U.S. Cl. ................................ 365/225.7; 365/185.04
(58) Field of Search ............................. 365/225.7, 200, 365/185.04

(56) References Cited

U.S. PATENT DOCUMENTS

| 4,816,757 A | * | 3/1989 | Hutchins ................. 365/225.7 |
| 5,083,293 A | * | 1/1992 | Gilberg et al. ........... 365/225.7 |
| 5,966,335 A | * | 10/1999 | Nozaki ...................... 365/200 |
| 6,141,245 A | * | 10/2000 | Bertin et al. ............. 365/225.7 |
| 6,292,422 B1 | * | 9/2001 | Pitts ........................ 365/225.7 |

* cited by examiner

Primary Examiner—Trong Phan
(74) Attorney, Agent, or Firm—Pedro P. Hernandez; W. James Brady, III; Frederick J. Telecky, Jr.

(57) ABSTRACT

A circuit (100) for protecting sensitive data stored in a storage area (108) includes a one time programmable device such as a fuse element (104) coupled to the input data path (102), and a one time programmable device such as fuse element (112) coupled to the output data path (118). Once sensitive data is loaded into the storage area (108), either one of, or both of the fuses (104, 112) can be activated (blown) in order to prevent access to the data stored in storage area (108). Optionally, a fuse element (130) can also be added to the internal circuit data line (120) that would prevent both internal and external access to the stored data.

14 Claims, 2 Drawing Sheets

METHOD AND APPARATUS FOR STORING DATA IN AN INTEGRATED CIRCUIT

CROSS-REFERENCE TO RELATED APPLICATIONS

This application claims the benefit of U.S. Provisional Application No. 60/247,544, and filed on Nov. 9, 2000.

TECHNICAL FIELD

This invention relates in general to the field of electronics and more specifically to a method and apparatus for storing secure data within an integrated circuit.

BACKGROUND

Many electronic devices require the use of secure and private data that may be used to authenticate transactions, enable special access to specific functions, etc. Given the sensitive nature of this type of data, the data typically needs to be stored within an integrated circuit (IC). This type of sensitive data should not be able to be retrieved externally from the IC either from the IC pins themselves or by using any number of reverse engineering methods, including de-layering of the IC. A need exists in the art for

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
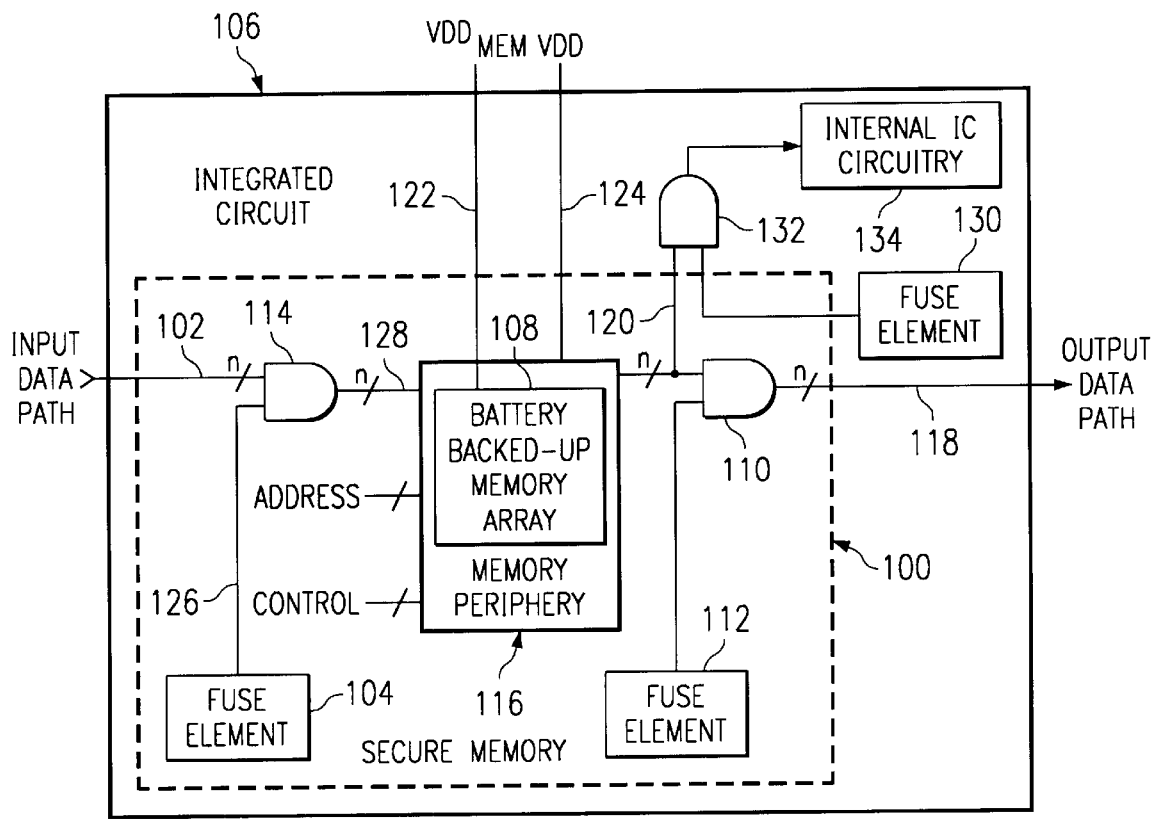
FIG. 1 shows a circuit for providing secure data within an integrated circuit in accordance with the invention.

While the specification concludes with claims defining the features of the invention that are regarded as novel, it is believed that the invention will be better understood from a consideration of the following description in conjunction with the drawing figures, in which like reference numerals are carried forward.

Referring now to FIG. 1, there is shown a circuit 100 for providing secure data within an integrated circuit (IC) 106. The IC 106 contains a secure memory array (storage location) 108 which may be realized using any one of a number of memory elements. For example, RAM, FIFO memory, shift registers, or any other type of logic circuit which needs only leakage current to sustain its state when it is not being accessed. The secure memory array 108 is supported by a memory periphery 116 consisting of a circuit to allow access to the secure memory array 108. The memory periphery 116 contains decode and routing logic.

The circuit 100 also contains input 102 and output 118 data paths. These data paths must be available to the I/Os of the IC 106 in order to allow loading and testing of the secure memory array 108. In accordance with the invention, both the input 102 and output 118 data paths have the capability of being locked out by programming a "one-time programmable device" such as a fuse (or anti-fuse) 104 element at the input bus and a fuse (or anti-fuse) 112 at the output bus which gates the data in or out of the input/output data paths 102, 118.

At wafer and/or package level testing of IC 106, power is applied to the IC 106 including the secure circuit 100, memory periphery 116, and the secure memory array 108 during testing of IC 106. Data is then loaded into memory array 108 via input data path 102. The inputted data is then tested via the output data path 118, in order to test the memory array 108. Once the IC 106 is embedded in a host system (any electronic device that requires secure data storage, the host can include a built-in battery for supplying power to memory array 108), power is applied to the host system. The secure memory array power supply 122 must be permanent in order to maintain the contents of the secure memory array 108.

Once power is applied to memory array 108, IC 106, circuit 100, and the memory periphery 116 secure data can be loaded into memory array 108 via input data bus 102. The loaded secure data can then be tested via output data path 118 in order to verify it has been loaded properly. After the data to be stored in memory array 108 is loaded, fuse elements are "blown". In the case that fuse elements 104 and 112 are fuses and not anti-fuses, elements 104 and 112 when they are blown, are changed from a first state in which they form electrical short circuits to a second state in which they form electrical open circuits. By blowing fuses 104 and 112, the input and output paths 102 and 118 are logically blocked and external access to the secure data stored in memory array 108 is prevented.

Fuse elements 104, 112 can be blown as one example, using a control signal provided by a device controller such as a microprocessor or other control hardware. Alternatively, the IC 106 can have a "blow fuse" pin 302, as shown in FIG. 3, where a signal such as an appropriate voltage level can be sent to blow the fuse(s) 104, 112.

Figure 3:
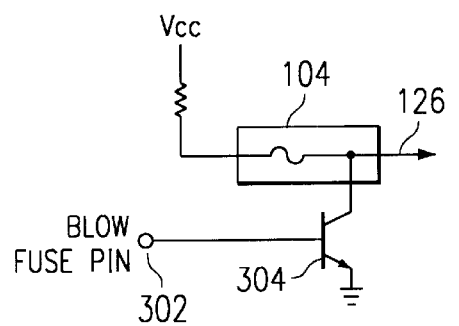
FIG. 3 shows a schematic of a fuse element in accordance with the invention.
Figure 4:
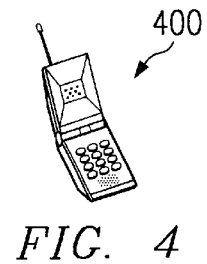
FIG. 4 shows a drawing on an electronic device such as a radio which utilizes the present invention.

In FIG. 3, the control signal (e.g., voltage) provided at blow fuse pin 302 causes a power transistor 304 that is coupled to the fuse element 104 to activate and blow the fuse element 104. This causes fuse element 104 to form an electrical open circuit. From a logic level standpoint, the input to AND gate 114 and 110 provided by fuse element 104 and 112 respectively, are typically a logic high before the fuse elements are blown (fuses intact). Once they are blown, the fuse element circuits 104, 112 provide logic lows to their respective AND gates 114 and 110. This causes any data presented on input path 102 not to pass through the AND gate to the memory array 108. Similarly, the logic low provided by fuse element 112, once it is blown, causes the AND gate 110 to block any data flow through output data path 118 since the AND gate output is always a logic low.

Although FIG. 1 shows the fuse elements connected to a logic circuit (AND gates 114 and 110) other designs can be done which accomplish the same, software protection. For example, instead of using fuses, another one-time settable (programmable) device such as an anti-fuse can be used. In contrast to a fuse, an anti-fuse is a device, which initially does not provide an electrical connection (electrical open circuit), and when it is "blown" (activated) an electrical connection (short-circuit) is formed. If an anti-fuse is used, then a different logical circuit design is needed to accommodate the change from the electrical open circuit provided by a fuse element when it is activated, versus the electrical short circuit provided by an anti-fuse when it is activated.

The secure memory array 108 requires a power supply, $VDD_{MEM}$ 122. This supply is preferably a very low current dedicated supply to the memory array 108 because power must be maintained so the data will not be lost. Because the leakage current can be designed to be very low for any of the several types of memory elements mentioned above, this allows the use of a long life battery cell or a system rechargeable battery cell to provide the necessary power. Any of these battery types must be able to provide adequate power to the memory array 108 for the life of the device (long life cell) or between recharges (rechargeable cell). Since the memory supply must supply power during the reading of the memory, to minimize power consumption, it may be advantageous for the host system to include shadow memory to enable the secure memory to be loaded only at power up and/or system resets.

The host system which includes circuit 100 can include battery monitoring circuitry to inform the host system user in the case that the battery power level is low and that data could be lost if not corrected. Presumably, a technique, which allows changing batteries without interrupting memory array power, can also be implemented as part of the host system design.

The fuse (or anti-fuse) elements 104 and 112 should be permanently and physically alterable devices which, once programmed, should isolate the input 102 and output 118 data paths from the I/Os of the host. Note that fuses (or antifuses) 104, 112 should not be programmed until permanent power has been applied to the secure memory array 108.

Different levels of data protection can be achieved with circuit 100 as shown in TABLE 1:

TABLE 1

|  | Input Path (102) | Output Path (118) |
| --- | --- | --- |
| Case 1: | Disabled | Disabled |
| Case 2: | Enabled | Disabled |
| Case 3: | Disabled | Enabled |
| Case 4: | Enabled | Enabled |

Case 1 is the most secure case where both the input 102 and output 118 paths are disabled. Case 3 can be used to implement a read only memory which is one-time programmable in a system without the need for special processes (e.g. PROM). While Case 4 can be used to implement an inexpensive modifiable non-volatile memory without need for special processes (e.g. EEPROM or flash). Case 2 would allow for adding additional data into memory array 108 while protecting the data once stored.

The host IC 106 which uses protection circuit 100 can ascertain information stored in memory array 108 via internal IC output path 120, while the input 102 and output 118 data path which are externally accessible via the IC I/O pins are blocked once the fuse elements 104, 112 are tripped. Data stored in the secure memory array cannot be ascertained, even by use of reverse engineering techniques. Removing a chip from the host circuit board causes the IC to loose power; hence, the secure data is lost. Should an attempt be made to reverse engineer (via de-layering) a chip in situ, then the memory elements power could be provided via an upper level metal which, if removed, would disconnect power from the memory array, causing it to lose its contents. This implementation is more secure than using programmable read-only memory or fuse (or anti-fuse) elements for storing the secure memory because these elements can be reverse engineered to determine their states, even without power. While a logic element leaves no trace of its state when power is lost.

Figure 2:
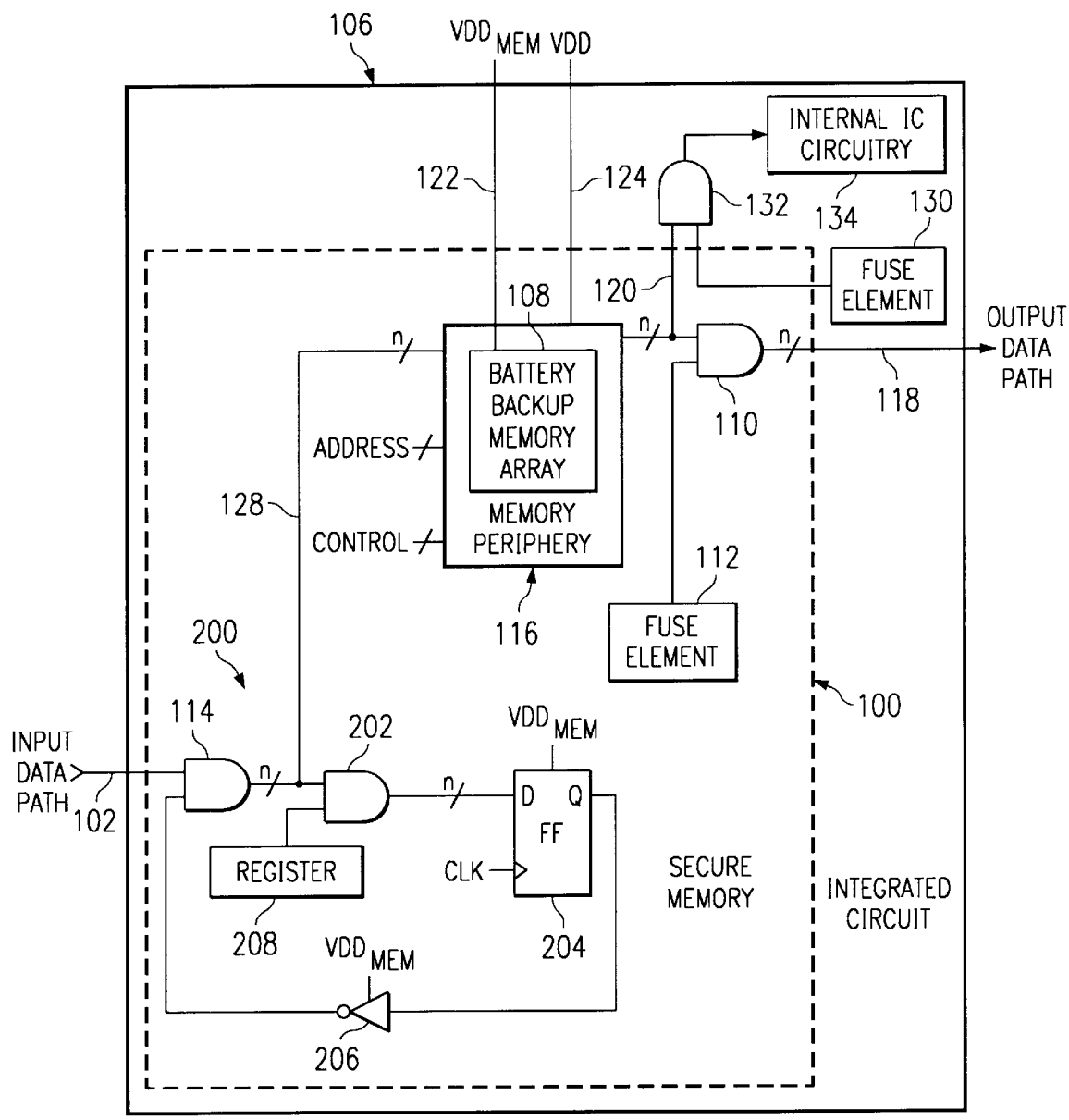
FIG. 2 shows a second embodiment of a circuit for providing secure data within an integrated circuit in accordance with the invention.

The programmable fuse elements can also be augmented by or replaced by a logic protection circuit 200 (e.g. a comparator) which is enabled by a key as shown in FIG. 2. The logic protection circuit includes an additional AND gate 202, a flip-flop 204, inverter 206 and a register 208. Once a separate standalone protection bit (e.g. shift register 208) stored within the battery backed up memory 108 is provided to AND gate 202, it disables the input data path 102 (similar circuitry as shown in FIG. 2 can be added to also disable the output path 118 similar to what is done to the input path 102 as shown in FIG. 2). If power is lost, the input/output data paths are restored, but the data will also have been destroyed by the power loss. While this would increase the flexibility of the circuit since it would allow for new data to be stored in memory array 108, this could also compromise the secure memory more than a permanently changed element as shown in FIG. 1.

If a logic protection bit is used as shown in FIG. 2 in addition to a permanently changed elements as shown in FIG. 1, the security would be augmented. One or more bits could be used with multiple bits used to implement a key that would be several bits wide.

The memory array 108 could also be partitioned such that there is an independent key for different blocks within the memory array 108. This makes for a more efficient solution if multiple secure memory blocks are required. One would not have to implement several secure memory arrays if partitioning is used in association with independent keys for each partition.

Advantages of the present invention, include that the memory array can be fully tested in both wafer and package forms before programming the fuse elements. The end-customer of the IC 106 handles the secure data, optimizing security concerns and allowing the integrated circuit manufacturer to not have to handle the logistics associated with the secure data. Another advantage is that multiple implementations (with different uses and levels of protection) of this structure can be included in a design.

Additionally, the design of the present invention could integrate a "kill" feature to disable the internal IC output path 120 by using another fuse element 130 and logic gate 132 in order to block the data path to internal IC circuitry 134. This would allow a customer to disable use of any secure data in the event, that a device becomes "unauthorized" (e.g., stolen). In the case of a wireless device, the kill signal could be sent via the wireless system or via a network in case the host device to circuit 100 is a networked device.

A function can also be integrated which would "zero out" the secure data per a customer command (handled as a signal in the control port). This could be implemented without using an additional fuse element. If the input path were disabled, the secure memory on this device would no longer be usable. A battery in a package would enable the devices to be tested in the package. It would then become optional when programming of the secure memory 108 occurs, either post final test or per the customer. The latter greatly facilitates logistics for secure data handling.

$VDD_{MEM}$ should operate off system power, when available, to maximize the life of the auxiliary ($VDD_{MEM}$) power source. If fact, if the auxiliary source is rechargeable, then having a system voltage higher than that of the auxiliary power source could recharge the auxiliary source. The auxiliary power source would kick in if the system voltage became lower or non-existent to maintain the state of the secure memory. In fact, the lower the auxiliary voltage the lower the quiescent power of the secure memory as long as the voltage is high enough to maintain the memory states. A control circuit must be carefully designed to insure the auxiliary power does not have a low impedance path to the system power in the event that the system voltage is lower. A power supply control circuit with a battery input and a system power input could then be used to route power to VDD and $VDD_{MEM}$ depending on which of these supplies are available. If the system supply is available, then the battery input could be disabled allowing it to maintain its charge, or the system supply could be used to charge a battery. The system supply could be provided to the memory periphery to allow reading/writing. If the battery is the only voltage present, then a lack of a peripheral voltage would prevent reading/writing and internal data availability. Finally, if the system has the capability of programming electrical fuses then this circuit could be used to implement a field programmable ROM or a field programmable/re-programmable ROM quite easily.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A circuit for protecting sensitive data, comprising:
   an input data path;
   a memory area for storing the sensitive data, the memory area coupled to the input data path;
   a first one-time programmable device coupled to the input data path which when placed in a first state, sensitive data applied to the input data path is allowed to be loaded into the memory area, and when it is placed in a second state, sensitive data applied to the input data path is not allowed to be loaded into the memory area; and
   wherein the one-time programmable device comprises a logic protection circuit comprising:
      a first logic gate having a first input port coupled to the input data path and an output port coupled to the memory area;
      a register having a protection bit stored therewith;
      a second logic gate having a first input port coupled to the output port of the first logic gate and a second input port coupled to the register, and an output port;
      said first logic gate having a second input port coupled to the output port of the second logic gate; and
      wherein when said protection bit stored within the register is presented to the second logic gate, the first logic gate prevents data located in the input data path from being sent to the memory area.

2. A circuit as defined in claim 1, wherein the register is located within the memory area.

3. A circuit as defined in claim 2, further comprising a flip-flop coupled between the output port of the second logic gate and the first input port of the first logic gate.

4. A circuit as defined in claim 3, wherein the first and second logic gates comprise logical AND gates.

5. A circuit as defined in claim 1, further comprising:
   an output data path coupled to the memory area; and
   a second one-time programmable device coupled to the output data path which when placed in a first state, the sensitive data stored in the memory area can be accessed via the output data path, and when the second one-time programmable device is placed in a second state, the sensitive data stored in the memory area can not be accessed via the output data path.

6. A circuit as defined in claim 1, wherein the one-time programmable device comprises a fuse.

7. A circuit as defined in claim 1, wherein the one-time programmable device comprises an anti-fuse.

8. A circuit as defined in claim 6, wherein the circuit further comprises:
   a logic gate having a first input coupled to the input data path, a second input coupled
   to the fuse element and an output coupled to the memory area.

9. A circuit as defined in claim 8, wherein the logic gate comprises an AND gate.

10. A circuit as defined in claim 5, wherein the one-time programmable device and the second one-time programmable device both comprise fuses.

11. A circuit as defined in claim 5, further comprising:
    internal IC circuitry;
    an internal integrated circuit (IC) output data path coupled to the memory area; and
    a third one-time programmable device coupled to the internal integrated circuit output data path, said third one-time programmable device when placed in a first state allows data to be sent from the memory area via the internal integrated circuit output data path to the internal IC circuitry, and when placed in a second state, the third one-time programmable output data path prevents data from being sent from the memory area via the internal integrated circuit output data path.

12. A circuit for protecting sensitive data, comprising:
    an output data path;
    a memory area for storing the sensitive data coupled to the output data path; and a one-time programmable device coupled to the output data path which when placed in a first state, data located in the memory area data path is allowed to be retrieved via the output data path, and when the one-time programmable device is placed in a second state, data stored in the memory area is not allowed to be retrieved via the output data path; and
    the one-time programmable device comprises a logic protection circuit comprising:
      a first logic gate having a first input port coupled to the output data path and an output port coupled to the memory area;
      a register having a protection bit stored therewith;
      a second logic gate having a first input port coupled to the output port of the first logic gate and a second input port coupled to the register, and an output port;
      said first logic gate having a second input port coupled to the output port of the second logic gate; and
      wherein when said protection bit stored within the register is presented to the second logic gate, the first logic gate prevents data stored in the memory area from being accessed via the output data path.

13. A circuit as defined in claim 12, wherein the register is located within the memory area.

14. A circuit as defined in claim 13, further comprising a flip-flop coupled between the output port of the second logic gate and the first input port of the first logic gate.

* * * * *